(12) United States Patent  
Xu

(10) Patent No.: US 9,767,750 B2  
(45) Date of Patent: Sep. 19, 2017

(54) GOA UNIT FOR CO-DRIVING GATE AND COMMON ELECTRODES, DRIVE CIRCUIT AND ARRAY

(71) Applicant: SHENZHEN CHINA STAR OPTOELECTRONICS TECHNOLOGY CO., LTD., Shenzhen, Guangdong (CN)

(72) Inventor: Xiangyang Xu, Shenzhen (CN)

(73) Assignee: Shenzhen China Star Optoelectronics Technology, Co., Ltd., Shenzhen, Guangdong (CN)

( * ) Notice: Subject to any disclaimer, the term of this patent is extended or adjusted under 35 U.S.C. 154(b) by 461 days.

(21) Appl. No.: 14/383,029

(22) PCT Filed: Feb. 20, 2014

(86) PCT No.: PCT/CN2014/072288  
§ 371 (c)(1),  
(2) Date: Sep. 4, 2014

(87) PCT Pub. No.: WO2015/109624  
PCT Pub. Date: Jul. 30, 2015

(65) Prior Publication Data  
US 2016/0240158 A1   Aug. 18, 2016

(30) Foreign Application Priority Data  
Jan. 27, 2014 (CN) .......................... 2014 1 0040824

(51) Int. Cl.  
*G09G 5/00* (2006.01)  
*G09G 3/36* (2006.01)  
*G11C 19/28* (2006.01)

(52) U.S. Cl.  
CPC ......... *G09G 3/3677* (2013.01); *G09G 3/3696* (2013.01); *G11C 19/28* (2013.01);  
(Continued)

(58) Field of Classification Search  
CPC ....... G09G 3/3611–3/3696; G09G 2300/0408; G09G 2310/0216  
See application file for complete search history.

(56) References Cited

U.S. PATENT DOCUMENTS

| 2012/0081346 A1 | 4/2012 | Furuta et al. ................. 345/209 |
| 2012/0249502 A1* | 10/2012 | Takahashi ............ G09G 3/3677 345/205 |
| 2013/0181747 A1* | 7/2013 | Yoon .................... G11C 19/184 327/108 |

FOREIGN PATENT DOCUMENTS

| CN | 102237048 A | 11/2011 |
| CN | 102959615 A | 3/2013 |

(Continued)

OTHER PUBLICATIONS

Search Report dated Sep. 28, 2014, issued to International Application No. PCT/CN2014/072288.

*Primary Examiner* — William Boddie  
*Assistant Examiner* — Jeffrey A Parker  
(74) *Attorney, Agent, or Firm* — Kim Winston LLP

(57) ABSTRACT

The present disclosure discloses a GOA unit for co-driving a gate electrode and a common electrode, including: a trigger; a first selective input circuit; a second selective input circuit which is used to respectively gate the high level input for common electrode and the high level input for gate electrode to the clock end of the trigger in different time sequences to pull up the voltage on the trigger output end; a third selective input circuit which is used to select level signals or edge signals on gate line n+1 and gate line n+4 to serve as the reset signal of the trigger; a fourth selective input circuit which is used to pull down the voltage thereon; a selective output circuit with the input being connected to (Continued)

the trigger output end, for selectively outputting a gate electrode driving signal or a common electrode driving signal.

16 Claims, 6 Drawing Sheets

(52) U.S. Cl.
CPC ... *G09G 3/3655* (2013.01); *G09G 2300/0809* (2013.01); *G09G 2300/0842* (2013.01); *G09G 2310/0286* (2013.01); *G09G 2310/08* (2013.01); *G09G 2320/0219* (2013.01)

(56) References Cited

FOREIGN PATENT DOCUMENTS

CN            103440849 A    12/2013
EP            2 448 119 A3    8/2012

\* cited by examiner

GOA UNIT FOR CO-DRIVING GATE AND COMMON ELECTRODES, DRIVE CIRCUIT AND ARRAY

FIELD OF THE INVENTION

The present disclosure relates to the technical field of liquid crystal display, and particularly to a GOA unit for co-driving a gate electrode and a common electrode, a drive circuit and an array.

BACKGROUND OF THE INVENTION

A GOA technology, namely Gate Driver on Array is a technology in which gate drive circuits (Gate Driver ICs) are directly manufactured on an array substrate (Array); instead of external silicon wafer connected thereto. Due to the application of this technology, the gate drive circuit can be directly processed on the periphery of a panel, thereby reducing the making procedures and lowering the product cost. In addition, the high integration of a TFT-LCD panel is further improved, to make the panel thinner.

However, in the two-level driving, among a variety of different feed through voltages, the feed through voltage generated by Cgd is dominant. Therefore, in the case of the two-level driving, the voltage of a common electrode needs to be regulated, in order to improve the gray scale quality.

When the common electrode COM is driven by direct current DC, the feed through voltage across the Cgd is:

$$(Vg\_high - Vg\_low) * Cgd/(Cgd + Clc + Cs),$$

wherein Vg_high and Vg_low represent respectively voltages for opening and closing the wires of the gate drive circuit, and Cgd, Clc and Cs are respectively parasitic capacitance of TFT, liquid crystal capacitance and storage capacitance.

Since the feed through voltage is mainly caused by pull down of a pixel voltage by change of a gate voltage in the case of TFT closing by means of the parasitic capacitance Cgd. No matter the pixel voltage is positive or negative, the feed through voltage will always pull the pixel voltage down to be negative.

In the prior art, the impact from the feed through voltage can be reduced by compensating the voltage of the common electrode. But since Clc is not a fixed parameter, the impact from the feed through cannot be eliminated by regulating the drive voltage of the common electrode, such that the objective of improving the image quality is difficult to achieve.

At present, a simple and feasible GOA circuit design needs to be provided to reduce and even eliminate the feed through voltage, so as to improve the gray scale quality of the display.

SUMMARY OF THE INVENTION

To solve the above-mentioned technical problems, the present disclosure provides a GOA unit for co-driving a gate electrode and a common electrode, including:

a trigger, including an input end, a clock end, a reset end, a low level input end and a trigger output end;

a first selective input circuit, including two reverse cutoff diodes connected in parallel, wherein the anodes of the diodes are respectively connected with the outputs of the gate line n−1 and gate line n+2, and the cathodes of the diodes are used as outputs to be connected with the input end, in order to select level signals or edge signals in the gate line n−1 and gate line n+2 to serve as the input stimulus signal of the trigger;

a second selective input circuit with the output being connected with the clock end, including four clock pulse inputs having the same cycle but working asynchronously, a high level input for the common electrode and a high level input for gate electrode, so as to respectively gate the high level input for common electrode and the high level input for gate electrode to the clock end of the trigger under different time sequences to pull up the voltage on the trigger output end;

a third selective input circuit, including two reverse cutoff diodes connected in parallel, wherein the anodes of the diodes are respectively connected with the outputs of gate line n+1 and gate line n+4, and the cathodes of the diodes are used as outputs to be connected with the reset end, in order to select level signals or edge signals on gate line n+1 and gate line n+4 to serve as the reset signal of the trigger;

a fourth selective input circuit with the output being connected with the low level input end, for respectively gating a gate low level input or a common electrode low level input to the low level input end of the trigger under the control of signals on gate line n+1 and gate line n+4 to pull down the voltage thereon;

a selective output circuit with the input being connected to the trigger output end, for selectively outputting a gate drive signal or a common electrode drive signal in two of the four clock pulse sequences having the same cycle and working asynchronously. The two pulse sequences have a difference of ¾ work cycle.

According to one embodiment of the present disclosure, each reverse cutoff diode is a circuit equivalent to a diode composed of an MOS transistor or a TFT transistor, wherein the gate of the MOS transistor or TFT transistor is connected with a source thereof to serve as the anode, and the drain is used as the cathode.

According to one embodiment of the present disclosure, the level signals or edge signals in gate line n−1 and gate line n+2 are low level signals or falling edge signals, and the level signals or edge signals on gate line n+1 and gate line n+4 are high level signals or raising edge signals.

According to one embodiment of the present disclosure, the four clock pulse inputs having the same cycle and working asynchronously sequentially differ ¼ work cycle on phase.

According to one embodiment of the present disclosure, the common electrode drive signal output by the GOA unit circuit synchronizes with a signal on gate line n+3.

According to one embodiment of the present disclosure, the second selective input circuit includes four TFT transistors, wherein the sources and drains of two TFT transistors are connected, and two gates are respectively controlled by the second clock pulse input and the third clock pulse input, for introducing the high level input for gate electrode;

the sources and drains of the other two TFT transistors are connected, and the two gates are respectively controlled by the first clock pulse input and the fourth clock pulse input, for introducing the high level input for common electrode.

According to one embodiment of the present disclosure, the fourth selective input circuit includes two TFT transistors, wherein gates thereof are respectively connected to the outputs of gate lines n+1 and n+4, and the sources are correspondingly connected with the gate low level input and the common electrode low level input.

According to one embodiment of the present disclosure, the selective output circuit includes two 11-T transistors, wherein two gates thereof are respectively controlled by the third clock pulse input and the first clock pulse input, and the two sources are connected to the trigger output end together, in order to respectively output the signals of gate line n and common electrode line n+3 under different time sequences.

According to one aspect of the present disclosure, a display panel drive circuit is further provided, including a plurality of any of above-mentioned GOA units, wherein the GOA units are cascaded in the following manner:

the outputs of gate lines n−1 and n+2 are respectively used as the trigger signals of this grade of GOA unit; the outputs of gate lines n+1 and n+4 are respectively used as the reset signals of this grade of GOA unit; four clock lines are respectively connected with the clock pulse inputs on the second selective input circuit of this grade of GOA unit, in order to provide clock signals with the same cycle but in different phase; and the high level input for gate electrode and the high level input for common electrode are respectively introduced under different clock pulses to output corresponding pull-up voltages;

wherein the outputs of this grade of GOA unit include the outputs of gate line n and the common electrode line n+3.

According to another aspect of the present disclosure, an array with the above-mentioned driving circuit placed thereon is further provided, including:

a gate line and a common electrode line, which are arranged in parallel along the transverse direction; and a clock input line, a gate high and low level input line and a common electrode high and low level input line, which are arranged in parallel along the longitudinal direction, wherein the corresponding outputs of the gate line and the common electrode line in parallel have a difference of 3 grades on cascade positions, or ¾ work cycle on time sequence.

According to the present disclosure, since the output of the COM voltage synchronizes with the output of the GATE, and the variation of the voltage is just opposite to the gate voltage in direction, the feed through voltage is effectively counteracted, thereby improving the gray scale quality of the display.

Other features and advantages of the present disclosure will be set forth in the following description, and will be partially obvious from the description, or be understood by implementation of the present disclosure. The objectives and other advantages of the present disclosure can be achieved and obtained by structures particularly pointed out in the description, the claims and the accompanying drawings.

BRIEF DESCRIPTION OF THE DRAWINGS

The accompanying drawings are configured to provide a further understanding of the present disclosure, constitute a part of the description, and explain the present disclosure together with the examples of the present disclosure, but not limit the present disclosure. In the accompanying drawings.

DETAILED DESCRIPTION OF THE EMBODIMENTS

The embodiments of the present disclosure will be illustrated in detail below in combination with the accompanying drawings and examples. Therefore, an implementation process of how to use technical means of the present disclosure to solve technical problems and achieve a technical effect may be fully understood and implemented accordingly. It should be noted that, as long as no conflict is generated, various embodiments in the present disclosure and various features in the examples can be mutually combined, and the formed technical solutions are all within the protection scope of the present disclosure.

FIG. 1 to FIG. 4 show a GOA drive circuit in the prior art and a pulse sequence diagram generated therefrom. It can be seen that, the voltage on the common electrode COM is a DC voltage. The voltage pulses on the gate lines (Gate 1, Gate 2, Gate 3, . . . ) occur sequentially under the action of two clock sequences in opposite phase. The time for scanning all gate lines is a length of a frame, which is also the cycle of the pulses on the gate lines. Since trigger control is implemented by two clocks in opposite phase, the width of a positive pulse on each gate line is equal to the pulse width of the clock.

Figure 1:
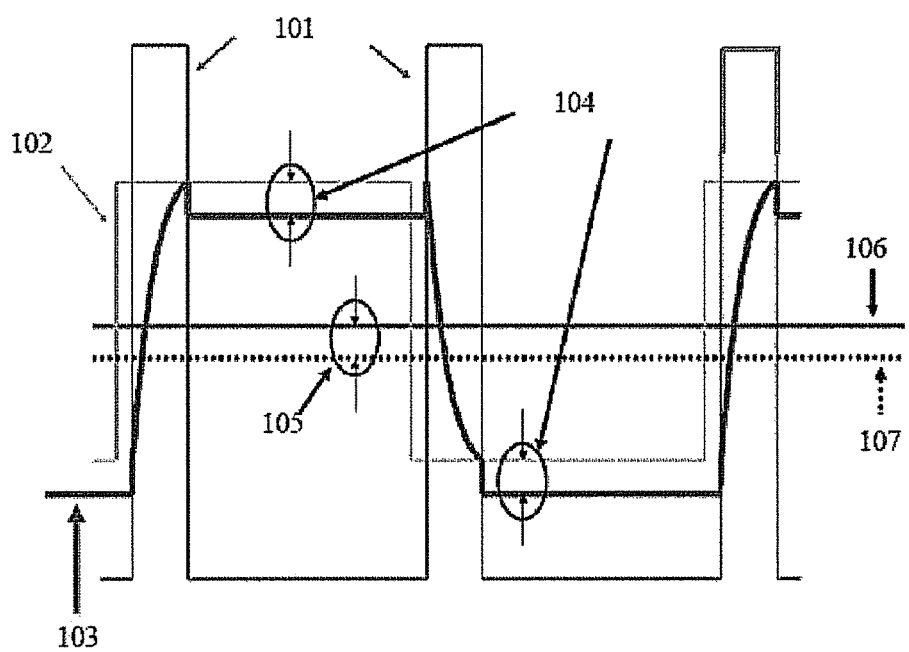
FIG. 1 shows a voltage waveform of DC drive of a common electrode in the prior art, wherein storage capacitance Cs (Cs on Com) is formed on the common electrode.

Further, FIG. 1 shows voltage waveforms occurring on each line at the same moment. 101 represents gate drive voltage pulse, 102 represents source drive voltage pulse, 103 represents a voltage on a pixel electrode, and 104 represents difference of a source voltage and a pixel voltage, the difference being equivalent to the feed through voltage. In order to eliminate the feed through voltage, the original COM voltage 106 can be corrected, and the corrected COM voltage is expressed by the numeral 107. The correction is equal to the feed through voltage value. However, it is difficult to correct the original voltage on the COM which is driven by Direct Current DC.

Figure 2:
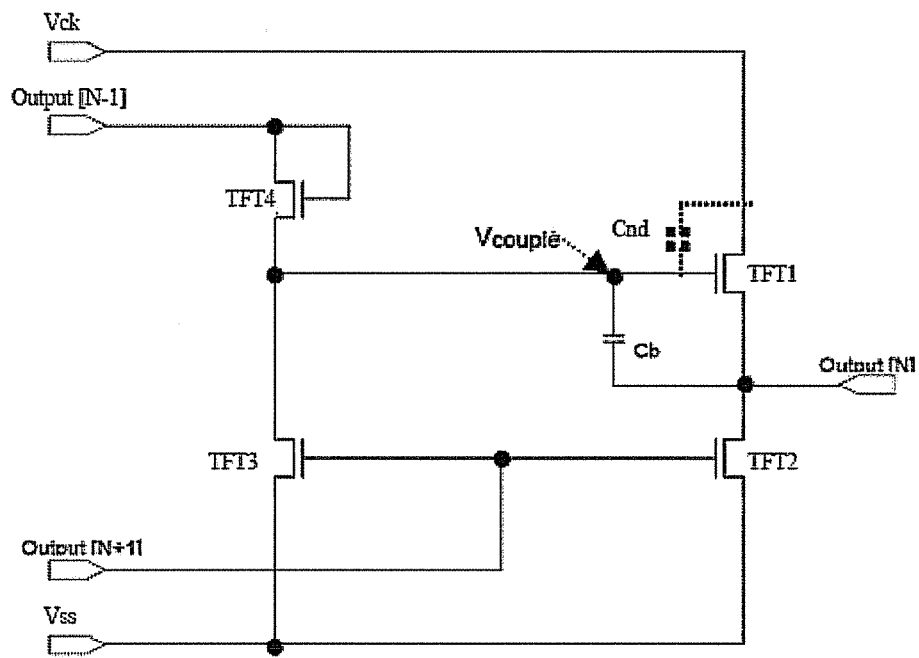
FIG. 2 shows a schematic of an internal circuit of a GOA unit adopted in the prior art.
Figure 3:
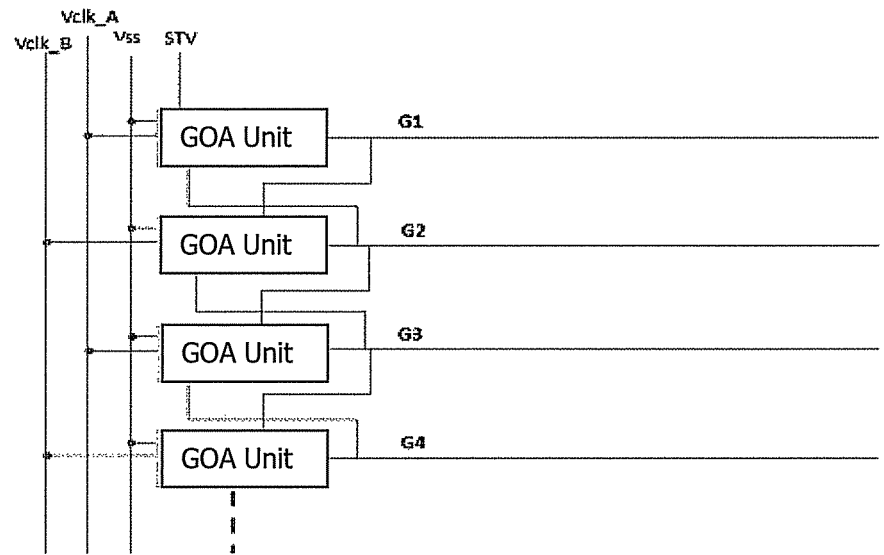
FIG. 3 shows a schematic diagram of a circuit cascading GOA units to form the two-level gate driving in the prior art.
Figure 4:
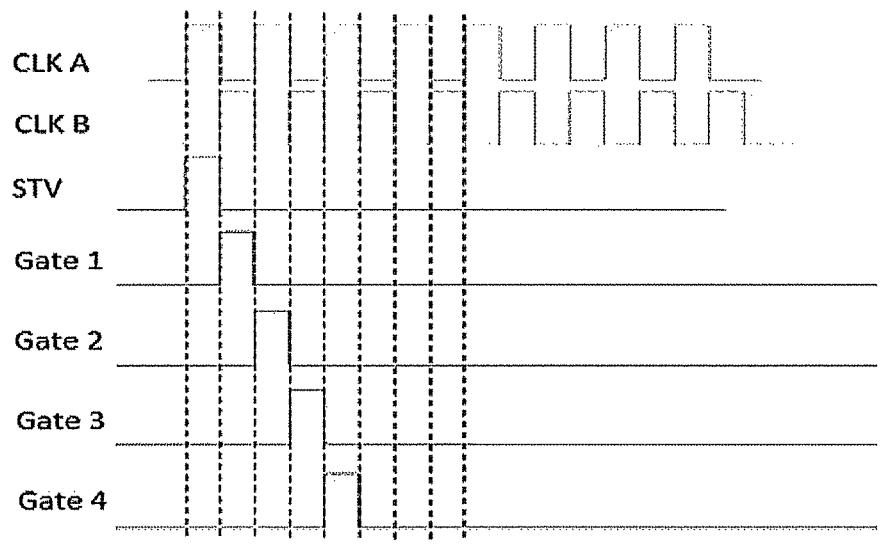
FIG. 4 shows a pulse sequence diagram of a gate drive circuit in the prior art.

In the prior art, as shown in FIG. 3, the drive circuit is composed of GOA units arranged on one side. These GOA units are cascaded to form the pulse sequence as shown in FIG. 4 on the outputs thereof. FIG. 2 further displays the internal circuit of the GOA unit in detail.

As shown in FIG. 2, the GOA unit is essentially a trigger. It includes four TFT switching transistors and one capacitor, wherein TFT1 is a drive switching transistor, TFT2 and TFT3 are reset switching transistors and TFT4 is a pre-charge switching transistor. Cb is the voltage holding capacitor of the TFT1 and is mainly controlled by the TFT4. Traditional GOA drive circuits need four control signals, those are a clock signal Clk, an input signal, a reset signal Reset, and a gate output low level signal Vss. The clock signal is a pull-up signal output from a gate line.

FIG. 3 shows a schematic diagram of a circuit cascading GOA units to form unilateral two-level gate driving in the prior art. The output of the former GOA unit is used as the trigger signal of this GOA unit, and the output of the next GOA unit is used as the reset signal of this GOA unit. Two clock signals (Vclk_A, Vclk_B) are adopted and are respectively used for GOA units of odd rows and GOA units of even rows. The gate line output voltage Vss determines the height or amplitude of the output pulse on the gate line.

As described above, these involve no regulation of the COM voltage, so that the feed through voltage is not eliminated.

Figure 5:
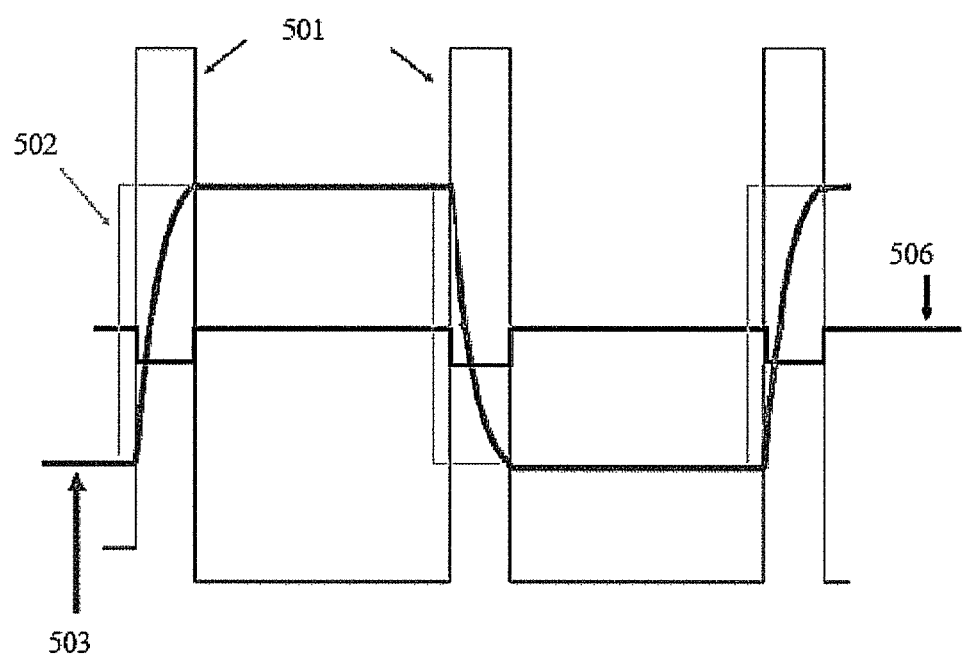
FIG. 5 shows voltage waveforms for enabling a common electrode drive circuit to synchronize with a gate drive circuit according to a principle of the present disclosure.

It will be introduced below that in the present disclosure, how to regulate the COM voltage in view of the above-mentioned principle. As described above, the necessary COM voltage variation is known, which is equivalent to the feed through voltage. Therefore, a time sequence as shown in FIG. 5 is acquired. Similar to FIG. 1, 501 represents gate drive voltage pulse, 502 represents source drive voltage pulse, 503 represents a voltage on a pixel electrode, and 506 represents a COM voltage drive signal. It can be seen from the figure that, in this case, feed through is completely eliminated by the variation of the COM voltage in theory.

According to this concept, the GOA drive circuit may be designed. The core GOA unit of the GOA drive circuit is as shown in FIG. 6.

The output of the GOA unit is used for co-driving a gate and a common electrode. It is mainly composed of a trigger 602 and some peripheral circuits. The trigger includes an input end 1, a clock end 2, a reset end 3, a low level input end 4 and a trigger output end 5.

In order to enable the common electrode drive and the gate drive share the trigger, the GOA unit further includes a first selective input circuit 603, which includes two reverse cutoff diodes connected in parallel. The anodes of the diodes are respectively connected with the outputs G[n−1] and G[n+2] of gate lines n−1 and n+2, and the cathodes of the diodes are used as outputs to be connected with the input end 1, in order to select level signals or edge signals G[n−1] and G[n+2] from gate lines n−1 and n+2 to serve as the input stimulus signal of the trigger 602.

Figure 6:
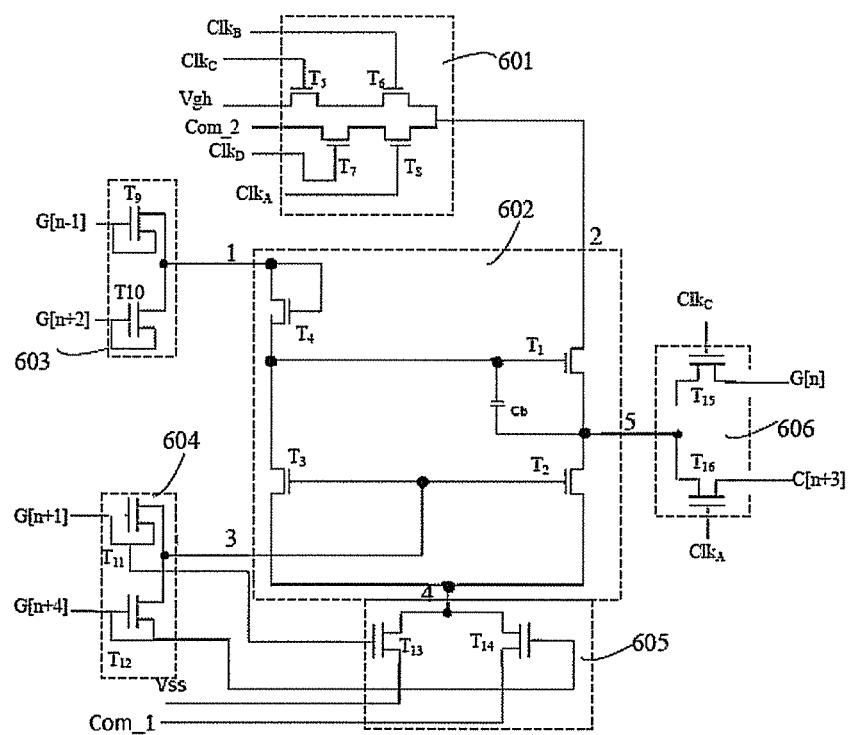
FIG. 6 shows a diagram of an internal circuit in a GOA unit integrating a common electrode drive output according to an embodiment of the present disclosure.

As shown in FIG. 6, the GOA unit further includes a third selective input circuit 604. The circuit is composed of two reverse cutoff diodes connected in parallel as well, wherein, similar to the mentioned above, the anodes of the diodes are respectively connected with the outputs G[n+1] and G[n+4] of gate lines n+1 and n+4, and the cathodes of the diodes are used as outputs to be connected with the reset end 3, in order to select level signals or edge signals G[n+1] and G[n+4] from gate lines n+1 and n+4 to serve as the reset signal of the trigger 602.

In the present disclosure, as shown in FIG. 6, the level signals or edge signals in gate lines n−1 and n+2, G[n−1] and G[n+2], are low level signals or dropping edge signals, and the level signals or edge signals on gate lines n+1 and n+4, G[n+1] and G[n+4], are high level signals or raising edge signals.

In FIG. 6, the diodes all adopt diode equivalent circuits composed of transistors, for example, T9-T12, wherein the gates and sources of the TFT transistors are connected to serve as the anodes, and the drains are used as the cathodes. Of course, the present disclosure is not limited thereto, for example, MOS transistors can also be adopted in the equivalent design.

The GOA unit of the present disclosure includes a second selective input circuit 601. The output of the second selective input circuit 601 is connected with the clock end 2 of the trigger, may include four clock pulse inputs ClkA, ClkB, ClkC, ClkD having the same cycle and working asynchronously, a high level input Com_2 for common electrode and a high level input Vgh for gate electrode, and is used for respectively gating the high level input for common electrode Com_2 and the high level input Vgh for gate electrode to the clock end 2 of the trigger 602 under different time sequences to further pull up the voltage on the trigger output end 5, so as to form high level of the gate scanning pulse output on grade n or high level of the common electrode pulse on grade n+3.

Specifically, in one embodiment, the second selective input circuit 601 may include four ITT transistors, wherein the sources and drains of two TFT transistors T5, T6 are connected, and two gates are respectively controlled by the second clock pulse input ClkB and the third clock pulse input ClkC, for accessing the high level input for gate electrode. The sources and drains of the other two TFT transistors T7, T8 are connected, and the two gates are respectively controlled by the first clock pulse input ClkA and the fourth clock pulse input ClkD, for accessing the high level input for common electrode.

Preferably, the four clock pulse inputs ClkA, ClkB, ClkC, ClkD having the same cycle and working asynchronously sequentially differ ¼ work cycle on phase. In this way, the output gate line pulse width and the common electrode line pulse width are equal to ½ of the clock pulse width.

In addition, the GOA unit further includes a fourth selective input circuit 605, the output of which is connected with the low level input end 4, for respectively gating a gate low level input or a common electrode low level input to the low level input end 4 of the trigger 602 under the control of outputs G[n+1] and G[n+4] of gate lines n+1 and n+4 to pull down the voltage thereon, so as to form low level of the gate scanning pulse output on grade n or low level of the common electrode pulse on grade n+3.

In one embodiment, the fourth selective input circuit 605 preferably includes two TFT transistors T13, T14, wherein the gates are respectively connected with the outputs G[n+1] and G[n+4] of gate lines n+1 and n+4, and the sources are correspondingly connected with a gate low level input Vss and a common electrode low level input Com_1.

The input of a selective output circuit 606 of the GOA unit is connected to the trigger output end 5, for selectively outputting a gate drive signal or a common electrode drive signal under two pulse time sequences in the four clock pulse inputs having the same cycle and working asynchronously. The two pulses have a difference of ¾ work cycle, so that the gate drive signal occurs earlier than the common electrode drive signal by three gate line pulse widths.

As shown in FIG. 6, the common electrode drive signal C[n+3] output by GOA unit circuit in grade n is synchronous with the signal G[n+3] on gate line n+3.

In one embodiment, the selective output circuit 606 preferably includes two TFT transistors T15, T16, wherein the two gates are respectively controlled by the third clock pulse input ClkC and the first clock pulse input ClkA, and the two sources are connected to the trigger output end 5 together, in order to respectively output an output G[n] of gate line n and an output C[n+3] of common electrode line n+3 under different time sequences.

Figure 7:
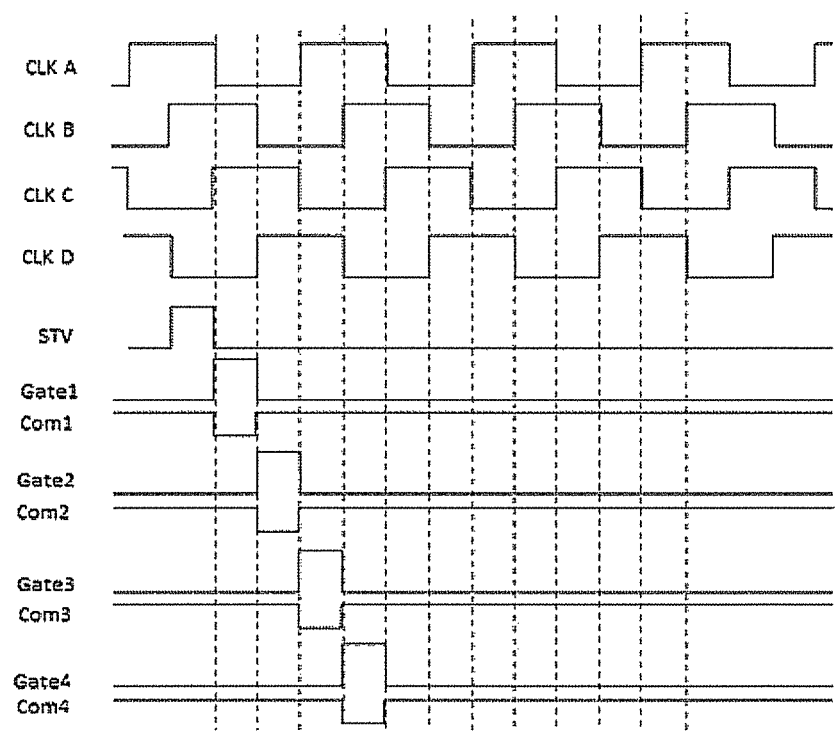
FIG. 7 shows a diagram of the drive pulse sequence generated by the cascading drive circuits according to the concept the present disclosure.

FIG. 7 shows a sequence diagram of drive pulses generated by the cascading drive circuits according to the concept the present disclosure.

It can be seen from the figure that, the four clock pulse inputs having the same cycle and working asynchronously sequentially differ ¼ work cycle on phase. When the pulse occurs on the gate line Gate1, the pulse occurs on Com1, thereby achieving the synchronous work of gate drive and common electrode drive.

According to one aspect of the present disclosure, a display panel drive circuit is further provided, including a plurality of above-mentioned GOA units, wherein the GOA units are cascaded according to the following manner.

The output G[n−1] of gate line n−1 and the output G[n+2] of gate line n+2 are respectively used as the trigger signals of this grade GOA unit, the output G[n+1] of gate line n+1 and the output G[n+4] of gate line n+4 are respectively used as the reset signals of this grade GOA unit, four clock lines are respectively connected with the clock pulse inputs ClkA, ClkB, ClkC, ClkD on the second selective input circuit of this grade GOA unit, in order to provide clock signals having the same cycle while having phase difference, and the high level input for gate and the high level input for common electrode are respectively gated under different clock pulses to output corresponding pull-up voltages, wherein the output of this grade GOA unit is the output G[n] of gate line n and the output C[n+3] of common electrode line n+3.

The present disclosure further provides an array substrate with the above-mentioned drive circuit being formed thereon, including: a gate line and a common electrode line, which are parallel in the transverse direction; and a clock input line, a gate high and low level input line and a common electrode high and low level input line, which are parallel in the longitudinal direction, wherein the outputs of the gate line and the public electrode line have a difference of 3 work cycles on cascade positions, or ¾ work cycle on time sequence.

Although the embodiments are described above, the foregoing are merely embodiments for facilitating the understanding of the present disclosure, rather than limiting the present disclosure. Any changes or alternatives conceived by the skilled ones in the art after reading the content disclosed herein will fall within the scope of the present disclosure. Accordingly, the scope of the present disclosure will be defined in the accompanying claims.

What is claimed is:

1. A gate driver on array (GOA) unit for co-driving a gate electrode and a common electrode, including:
   a trigger, having an input end, a clock end, a reset end, a low level input end and a trigger output end;
   a first selective input circuit, including two reverse cutoff diodes connected in parallel, wherein the anodes of the diodes are respectively connected with the outputs of gate line n−1 and gate line n+2, and the cathodes of the diodes are used as outputs to be connected with the input end, in order to select level signals or edge signals in the gate line n−1 and gate line n+2 to serve as the input stimulus signal of the trigger;
   a second selective input circuit with an output thereof being connected with the clock end, including four clock pulse inputs having the same cycle but working asynchronously, a high level input for common electrode and a high level input for gate electrode, so as to respectively gate the high level input for common electrode and the high level input for gate electrode to the clock end of the trigger in different time sequences to pull up the voltage on the trigger output end;
   a third selective input circuit, including two reverse cutoff diodes connected in parallel, wherein the anodes of the diodes are respectively connected with the outputs of gate line n+1 and gate line n+4, and the cathodes of the diodes are used as outputs to be connected with the reset end, in order to select level signals or edge signals on gate line n+1 and gate line n+4 to serve as the reset signal of the trigger;
   a fourth selective input circuit with an output thereof being connected to the low level input end, for respectively gating a gate low level input or a common electrode low level input to the low level input end of the trigger under the control of signals on gate line n+1 and gate line n+4 to pull down the voltage thereon; and
   a selective output circuit with an input thereof being connected to the trigger output end, for selectively outputting a gate electrode driving signal or a common electrode driving signal in two of the four clock pulse sequences having the same cycle and working asynchronously;
   wherein n indicates a serial number of a gate line; and the second selective input circuit includes four TFT transistors,
   wherein the sources and drains of two TFT transistors are connected with each other, and two gates are respectively controlled by the second clock pulse input and the third clock pulse input for introducing the high level input for gate electrode; and the sources and drains of the other two TFT transistors are connected with each other, and the two gates are respectively controlled by the first clock pulse input and the fourth clock pulse input for introducing the high level input for common electrode.

2. The GOA unit as recited in claim 1, wherein the reverse cutoff diode is a circuit equivalent to a diode composed of an MOS transistor or a TFT transistor, the gate of the MOS transistor or TFT transistor being connected with a source thereof to serve as the anode, and the drain being used as the cathode.

3. The GOA unit as recited in claim 1, wherein the level signals or edge signals in gate line n−1 and gate line n+2 are low level signals or falling edge signals, and the level signals or edge signals on gate line n+1 and gate line n+4 are high level signals or raising edge signals.

4. The GOA unit as recited in claim 1, wherein the four clock pulse inputs having the same cycle and working asynchronously differ from each other in sequence with ¼ work cycle on phase.

5. The GOA unit as recited in claim 1, wherein the common electrode driving signal output by the GOA unit circuit synchronizes with a signal on gate line n+3.

6. The GOA unit as recited in claim 5, wherein the fourth selective input circuit includes two TFT transistors, the gates being respectively connected to the outputs of gate lines n+1 and n+4, and the sources being correspondingly connected with the gate low level input and the common electrode low level input.

7. The GOA unit as recited in claim 5, wherein the selective output circuit includes two TFT transistors, two gates thereof being respectively controlled by the third clock pulse input and the first clock pulse input, and the two sources thereof being connected to the trigger output end together, in order to respectively output the signals of gate line n and common electrode line n+3 in different time sequences, wherein the two pulse sequences have a difference of ¾ work cycle.

8. A circuit for driving display panel, including a plurality of GOA unit as recited in claim 1, wherein the GOA units are cascaded in the following manner:
   the outputs of gate lines n−1 and n+2 are respectively used as the trigger signals of this grade of GOA unit, the outputs of gate lines n+1 and n+4 are respectively used as the reset signals of this grade of GOA unit and four clock lines are respectively connected with the clock pulse inputs on the second selective input circuit of this grade of GOA unit, in order to provide clock signals with the same cycle but in different phases, and the high level input for gate electrode and the high level input for common electrode are respectively introduced under different clock pulses to output corresponding pull-up voltages;

wherein the outputs of this grade of GOA unit include the outputs of gate line n and the common electrode line n+3.

9. The circuit as recited in claim 8, wherein the reverse cutoff diode is a circuit equivalent to a diode composed of an MOS transistor or a TFT transistor, the gate of the MOS transistor or TFT transistor being connected with a source thereof to serve as the anode, and the drain being used as the cathode.

10. The circuit as recited in claim 8, wherein the level signals or edge signals in gate line n−1 and gate line n+2 are low level signals or falling edge signals, and the level signals or edge signals on gate line n+1 and gate line n+4 are high level signals or raising edge signals.

11. The circuit as recited in claim 8, wherein the four clock pulse inputs having the same cycle and working asynchronously differ from each other in sequence with ¼ work cycle on phase.

12. The circuit as recited in claim 8, wherein, the common electrode driving signal output by the GOA unit circuit synchronizes with a signal on gate line n+3.

13. The circuit as recited in claim 12, wherein the second selective input circuit includes four TFT transistors, wherein the sources and drains of two TFT transistors are connected with each other, and two gates are respectively controlled by the second clock pulse input and the third clock pulse input, for introducing the high level input for gate electrode; and
the sources and drains of the other two TFT transistors are connected with each other, and the two gates are respectively controlled by the first clock pulse input and the fourth clock pulse input for introducing the high level input for common electrode.

14. The circuit as recited in claim 12, wherein, the fourth selective input circuit includes two TFT transistors, the gates being respectively connected to the outputs of gate lines n+1 and n+4, and the sources being correspondingly connected with the gate low level input and the common electrode low level input.

15. The circuit as recited in claim 12, wherein, the selective output circuit includes two TFT transistors, two gates thereof being respectively controlled by the third clock pulse input and the first clock pulse input, and the two sources thereof being connected to the trigger output end together, in order to respectively output the signals of gate line n and common electrode line n+3 in different time sequences, wherein the two pulse sequences have a difference of ¾ work cycle.

16. An array with the circuit as recited in claim 8 placed thereon, including:
a gate line and a common electrode line, which are arranged in parallel along a transverse direction; and
a clock input line, a gate high and low level input line and common electrode high and low level input lines, which are arranged in parallel along a longitudinal direction,
wherein the corresponding outputs of the gate line and the common electrode line have a difference of 3 grades in terms of cascade positions, or ¾ work cycle on time sequence.

* * * * *